(12) United States Patent
Stohler et al.

(10) Patent No.: US 12,027,038 B2
(45) Date of Patent: Jul. 2, 2024

(54) VISIBLE COMPONENTS WITH FUNCTIONAL COATING

(71) Applicant: AUDI AG, Ingolstadt (DE)

(72) Inventors: Frank Stohler, Ölbronn-Dürrn (DE); Peter Belkhofer, Kipfenberg (DE)

(73) Assignee: AUDI AG, Ingolstadt (DE)

( * ) Notice: Subject to any disclaimer, the term of this patent is extended or adjusted under 35 U.S.C. 154(b) by 203 days.

(21) Appl. No.: 17/619,043

(22) PCT Filed: Jun. 25, 2020

(86) PCT No.: PCT/EP2020/067849
§ 371 (c)(1),
(2) Date: Dec. 14, 2021

(87) PCT Pub. No.: WO2021/008849
PCT Pub. Date: Jan. 21, 2021

(65) Prior Publication Data
US 2022/0358832 A1     Nov. 10, 2022

(30) Foreign Application Priority Data
Jul. 12, 2019   (DE) .......................... 102019210315.4

(51) Int. Cl.
*G08C 17/02*     (2006.01)
*G01D 11/00*    (2006.01)
(Continued)

(52) U.S. Cl.
CPC ............. *G08C 17/02* (2013.01); *G01D 11/00* (2013.01); *G01S 7/003* (2013.01); *H05K 3/146* (2013.01); *G01S 13/931* (2013.01); *G01S 15/931* (2013.01); *G01S 17/931* (2020.01); *H04B 5/45* (2024.01)

(58) Field of Classification Search
CPC ......... G08C 17/02; G01D 11/00; G01S 7/003; G01S 13/931; G01S 15/931; G01S 17/931; G01S 7/521; G01S 17/88; H05K 3/146; H05K 3/284; H04B 5/45; B60R 13/00; B60R 16/03
See application file for complete search history.

(56) References Cited

U.S. PATENT DOCUMENTS

| | | | |
|---|---|---|---|
| 2003/0111902 A1 | 6/2003 | Thiede et al. | |
| 2006/0186997 A1* | 8/2006 | Ostertag | ................ G08C 17/04 340/626 |

(Continued)

FOREIGN PATENT DOCUMENTS

| | | |
|---|---|---|
| CN | 106414172 A | 2/2017 |
| CN | 107980175 A | 5/2018 |

(Continued)

OTHER PUBLICATIONS

Office Action issued on Nov. 7, 2023, in corresponding Japanese Application No. 2022-500791, 6 pages.

(Continued)

*Primary Examiner* — Adnan Aziz
(74) *Attorney, Agent, or Firm* — Maier & Maier, PLLC

(57) ABSTRACT

The present invention relates to visible components with a functional coating in the interior and exterior of motor vehicles and a method for the production thereof.

16 Claims, 1 Drawing Sheet

(51) Int. Cl.
  *G01S 7/00* (2006.01)
  *H05K 3/14* (2006.01)
  *G01S 13/931* (2020.01)
  *G01S 15/931* (2020.01)
  *G01S 17/931* (2020.01)
  *H04B 5/45* (2024.01)

(56) References Cited

U.S. PATENT DOCUMENTS

| | | | | |
|---|---|---|---|---|
| 2018/0207909 | A1* | 7/2018 | Vivier | B32B 17/10036 |
| 2018/0254551 | A1* | 9/2018 | Guretzky | B60R 13/005 |
| 2018/0370277 | A1* | 12/2018 | Kjellander | B44C 5/0461 |
| 2019/0090957 | A1* | 3/2019 | De Wijs | A61B 8/0841 |
| 2020/0393568 | A1* | 12/2020 | Grosser | C08J 7/05 |
| 2021/0384622 | A1* | 12/2021 | Caruso | H01Q 1/3233 |
| 2022/0065422 | A1* | 3/2022 | Caruso | B44F 9/10 |

FOREIGN PATENT DOCUMENTS

| | | |
|---|---|---|
| DE | 19955328 A1 | 7/2001 |
| DE | 10317638 A1 | 11/2004 |
| DE | 102004016227 A1 | 10/2005 |
| DE | 102006017178 A1 | 10/2007 |
| DE | 102006043907 A1 | 4/2008 |
| DE | 102008036012 A1 | 2/2010 |
| DE | 102011010861 A1 | 8/2012 |
| DE | 102015216793 A1 | 3/2017 |
| DE | 102017205192 A1 | 10/2018 |
| DE | 102017212784 A1 | 1/2019 |
| DE | 102018100728 A1 | 7/2019 |
| EP | 1654726 B1 | 4/2010 |
| EP | 3435874 A1 | 2/2019 |
| EP | 3435874 B1 | 2/2020 |
| JP | 3125587 U | 9/2006 |
| WO | 2007118759 A1 | 10/2007 |
| WO | 2019020716 A1 | 1/2019 |

OTHER PUBLICATIONS

KTI GmbH & Co. KG., "Installation of PDC sensors in the bumper"; KTI GmbH & Co. KG; Jan. 2015; 12 pages with English Translation.

International Preliminary Report on Patentability with English translation issued on Jan. 13, 2022, in corresponding International Application No. PCT/EP2020/067849; 17 pages.

International Search Report (with English translation) and Written Opinion (with Machine translation) issued on Sep. 22, 2020 in corresponding International Patent Application No. PCT/EP2020/067849; 15 pages.

German Examination Report issued on Aug. 24, 2022 in corresponding German Application No. 10 2019 210 315.4 (10 pp., including machine-generated English translation).

Office Action issued on Jul. 25, 2023, in corresponding Japanese Application No. 2022-500791, 5 pages.

1 Office Action issued on Jan. 24, 2023, in corresponding Japanese Application No. 2022-500791, 6 pages.

Office Action issued on Feb. 23, 2024, in corresponding Chinese Application No. 202080006920.8, 10 pages.

Office Action issued on Mar. 25, 2024, in corresponding Korean Application No. 10-2021-7027182, 6 pages.

* cited by examiner

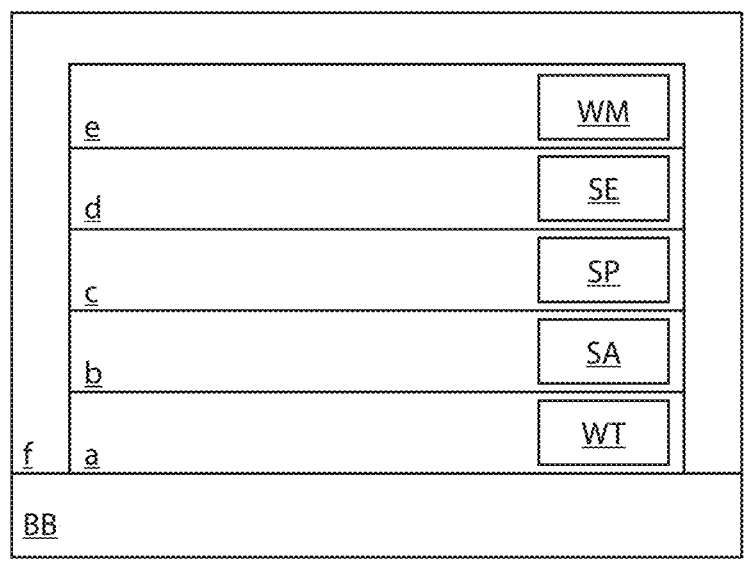

VISIBLE COMPONENTS WITH FUNCTIONAL COATING

FIELD

The present invention relates to visible components with a functional coating in the interior and exterior of motor vehicles and a method for the production thereof.

BACKGROUND

Sensors and cameras are currently installed as independent components in and on the vehicle. These systems take up a lot of space, are expensive, and therefore are very difficult to replace. The connectivity and the connection to a downstream computing unit take place via cables. These components are essential for all assistance systems in a vehicle, including things from parking sensors, lane assist and distance sensors, to components for autonomous driving. The variety of variants and costs are high; different technologies are required for almost every application. For example, a parking sensor is just a simple distance sensor, while cameras are required for traffic sign recognition, and even a combination of camera and radar sensor for distance control or an emergency brake assistant. A conventional radar sensor only provides a distance and an angle. This means there is only the information available that something is in the field of view of the sensor. Therefore, cameras are also installed.

Usually there are almost no redundancy systems. If a camera fails, or a radar sensor, or the cable connection to a downstream computing unit, the functionality is usually no longer available. Repairs have to meet extensive and complex requirements. The spare parts often have to be recalibrated because the replaced components have safety-relevant functions.

DE 10 2017 212 784 A1 discloses a trim part for a vehicle that comprises at least one integrated circuit board, which is completely surrounded by at least one thermoplastic component and/or at least one thermoset paint. The integration of the printed circuit board into the trim part means that no additional installation spaces are required that are external to the trim part and thus associated complex electrical and signaling couplings of the trim part and the printed circuit board. In one embodiment, the circuit board comprises at least one electronic component, which may be an optical sensor, for example an infrared sensor or lidar sensor, an acoustic sensor, for example an ultrasonic sensor, an electromagnetic sensor, for example an inductive sensor, capacitive sensor, or radar sensor, an acceleration sensor, a speed sensor, a temperature sensor, humidity sensor, or brightness sensor, and/or a light source, for example for displaying logos, lettering, symbols, shapes, or technical structures.

DE 10 2015 216 793 A1 discloses sensor for impact detection for a vehicle, which has an electrically conductive detection area to which a voltage is applied for continuous voltage and/or resistance measurement. The detection area is a deformable plastic body with a percolating network made of an electrically conductive filler. The detection area is designed in such a way that an impact of an object on the detection area causes a change in voltage and/or resistance.

EP 1 654 726 B1 relates to a sensor for a parking system and/or a close-range detection system of a motor vehicle, in particular an ultrasonic sensor. The sensor has a pot-shaped housing, the bottom of which is designed as a vibrating membrane. The housing has, at least on the outside, a coating that consists of weatherproof powder that can be enameled and does not, or does not significantly, negatively affect the vibration behavior of the membrane.

DE 103 17 638 A1 discloses an arrangement for impact detection with impact sensors on the outside of a motor vehicle and a pressure-sensitive paint on the motor vehicle body in contact with an impact sensor that changes an electrical parameter as a function of the pressure exerted.

DE 10 2011 010 861 A1 teaches a method for analyzing and optimizing radomes for a motor vehicle radar sensor. The method comprises a qualitative and a quantitative analysis of the radar-periodic transmission behavior of painted and plastic parts for the production of radome models. The radome models are subjected to a simulation process based on the results of the qualitative and quantitative analysis of the painted and plastic components. An optimized radome model is selected on the basis of the radar-periodic transmission behavior and the reflection behavior of the painted components and the plastic components. The radome is formed by a motor vehicle component, such as a bumper and trim.

DE 10 2008 036 012 A1 discloses a radome for a radar sensor in a motor vehicle, the wall of which consists of at least two layers. At least one inductively or capacitively acting device is arranged on one side of the wall or between two plastic layers, which device at least partially compensates for a reflection of the electromagnetic radiation of the radar sensor caused by the paint layer.

SUMMARY

Against this backdrop, the object of the present invention is to provide visual components having sensor functions for the interior and exterior of motor vehicles, which can be designed and used in a variable manner and can be manufactured cost-effectively.

BRIEF DESCRIPTION OF THE FIGURE(S)

FIG. shows an exemplary embodiment of a sequence of layers of a visible surface.

DETAILED DESCRIPTION

The subject matter of the invention is a visible component for a motor vehicle, comprising a base body with a visible surface and at least one sensor element on the visible surface of the base body. According to the invention, the at least one sensor element is electrically connected to an element for wireless data transmission adjoining the at least one sensor element, by means of which measurement data from the sensor element can be transmitted wirelessly to an evaluation unit, and the element for wireless data transmission can be energized by an inductive activation element.

In one embodiment, the element for wireless data transmission is a passive RFID transponder. In another embodiment, the element for wireless data transmission is an NFC chip. In another embodiment, the element for wireless data transmission is configured for wireless optical data transmission (Optical Wireless Communication, OWC).

In one embodiment of the visible component, the at least one sensor element is connected to the element for wireless data transmission via amplification and/or preprocessing circuits.

In one embodiment of the visible component, a wavelength modulator is located on the at least one sensor element. In one embodiment, this is a wavelength modulator for radar. In one embodiment, this is a wavelength modulator for IR. No modulator is required for visible light.

In a further embodiment, the at least one sensor element has a diffusion-tight encapsulation. In one embodiment, the diffusion-tight encapsulation includes a wavelength modulator. The encapsulation can be carried out with parylene, $SiO_x$, or also with spinel ($MgAl_2O_4$) for greater hardness (factor 150 compared to normal glass).

The visible component according to the invention can be used both outside of a vehicle and inside, for example for interior monitoring. In one embodiment, the base body of the visible component is a component for the exterior of a motor vehicle, for example a body component, in particular a bumper, a grille, a front or rear window. In another embodiment, the base body of the visible component is a component for the interior of a motor vehicle. In a further embodiment, the base body is a film, in particular a self-adhesive or magnetic film.

The passive RFID transponder, which is integrated as a printed circuit under or behind the at least one sensor element (also referred to as a "sensor layer"), is used for wireless data transmission to a downstream computing unit. The wireless data transfer means that no physical connection (cable connection, electrodes) to a downstream computing unit is necessary.

The downstream data processing takes place in a manner known in principle to the person skilled in the art. In one embodiment of the visual component according to the invention, the at least one sensor element is set up to carry out data preprocessing, by means of which the data volume to be transmitted is reduced to the relevant data.

In one embodiment of the visible component, the passive RFID transponder is printed on the visible surface. In another embodiment, the passive RFID transponder is printed on a carrier film which is arranged on the visible surface. The carrier film can, in particular, be a film of the type used today for complete foils for coloring.

The RFID chip can be energized by an inductive activation element, i.e. the voltage supply of the passive RFID transponder and the at least one sensor element (the "sensor layer") takes place via an inductive voltage supply. In one embodiment, more than one inductive voltage supply is used. This fulfills a basic requirement for the safety of autonomous driving (consideration of legal requirements). A multi-voltage supply via induction transmitters provides safety-relevant redundancies for autonomous driving.

In one embodiment of the visible component, the at least one sensor element is printed on the visible surface. In another embodiment, the at least one sensor element is printed onto a carrier film which is arranged on the visible surface.

In one embodiment of the visible component, the at least one sensor element is provided for receiving radiation. In one embodiment, the radiation is infrared radiation. In another embodiment, the radiation is radar waves. In yet another embodiment, the radiation is radiation in the visible range.

In one embodiment of the visible component, the at least one sensor element comprises an organic polymer. Modern sensor materials mostly consist of organic polymers. These can be produced using different methods. Necessary electronic circuits can be printed.

By means of a suitable wavelength modulation, ranges can be incorporated that are sensitive to different wavelengths (e.g. radar and infrared). In this way, sensors for different wavelength ranges can be manufactured using the same manufacturing technology. The sensors (e.g. for radar and IR) are each based on the same basic principle of organic materials.

In one embodiment, the visible component comprises at least two sensor elements which are set up to receive radiation of different wavelength ranges (for example a sensor element for radar and a sensor element for infrared).

In one embodiment, the at least one sensor element is flat and has a maximum thickness of 1 to 2 µm. In one embodiment, the at least one sensor element consists of several layers, each of which has a thickness of less than 1 µm. In one embodiment, the at least one sensor element consists of five layers. The flat arrangement of the at least one sensor element enables a new design language, since the geometric limitations that exist in conventional electronic component groups are eliminated. The individual sensor elements can be arranged around a vehicle as desired, and any free-form surfaces can be implemented.

In a special embodiment, the passive RFID transponder and the at least one sensor element are arranged on a self-adhesive film that is only temporarily attached to a vehicle as a "mobile sensor."

According to the invention, in particular, the integration of sensor-active materials into coating systems, in particular paint systems, is provided. If the sensor elements according to the invention made of organic polymers are incorporated in paint systems, for example on the front or on the fenders of the vehicle, they can then be covered with the top coat and/or clear coat of the vehicle paintwork and thus incorporated under the top coat and/or clear coat. They are then protected from environmental influences. Due to the incorporating into an external paint system, interfaces that lead to undesired signal weakening and signal changes due to refraction, diffraction, scattering, etc. are avoided.

In one embodiment of the visible component, the at least one sensor element and the visible surface of the base body are at least partially covered by a common layer of a coating material. In a further embodiment, the at least one sensor element and the visible surface of the base body are completely covered with coating material.

As shown in the FIG., the subject matter of the invention also relates to a method for producing the visible component according to the invention, in which a sequence of layers is applied to a base body (BB), the sequence comprising
  a) a layer containing at least one element for wireless data transmission (WT);
  b) optionally a layer containing at least one signal amplification circuit (SA);
  c) optionally a layer containing at least one signal processing circuit (SP);
  d) a layer containing at least one sensor element (SE);
  e) optionally a layer containing at least one wavelength modulator (WM); and
  f) optionally encapsulation.

In one embodiment of the method, the base body first goes through the process steps known in principle for painting preparation, such as washing, pickling, passivating, or plasma activation and is then provided with a paint filler.

The sensor layer is applied to the base body in the following sequence:
  1. at least one element for wireless data transmission is applied as a printed circuit;
  2. if necessary, signal amplification circuits and/or pre-processing circuits are applied;
  3. at least one sensor element is applied;
  4. if necessary, a wavelength modulator is applied;
  5. optionally encapsulation.

In one embodiment, signal amplification circuits and/or signal preprocessing circuits are applied via physical vapor deposition (PVD) or plasma-assisted chemical vapor deposition (PACVD).

In one embodiment, the sensor elements are applied by PVD or PACVD. In another embodiment, the sensor elements are applied by printing.

In one embodiment, the sensor elements are constructed as OLEDs and comprise 3 to 5 layers. In one embodiment, the layers comprise two layers acting as electrodes. The production of such sensor elements is described in DE 10 2018 100728 A1.

In one embodiment, a wavelength modulator is applied, for example for radar or for IR. No modulator is required for visible light.

If necessary, a diffusion-tight encapsulation is also applied.

In one embodiment of the method, the components are then returned to the normal painting process, either for the base coat or the clear coat depending on need. If the component is not painted (radiator grille, inside of a windscreen, mobile film, etc.), the visible component can be supplied directly to assembly.

In the method according to the invention, the thickness of an individual layer is less than 1 μm, regardless of whether it is produced by printing or by coating. The thickness of the entire layer structure on the base body, i.e. the sensor layer, is a maximum of 1 to 2 μm.

One of the advantages of the method according to the invention is that it provides a cost-effective manufacturing method for the visible component according to the invention, in particular for repairs and replacements. With the method according to the invention, components with a plurality of sensors for different wavelength ranges, in particular for visible light, IR, and radar, can also be produced cost-effectively. Further advantages and embodiments of the invention result from the description.

It is apparent that the above-mentioned features and the features still to be explained hereinafter are usable not only in the particular specified combination but also in other combinations or alone, without going beyond the scope of the present invention.

The invention claimed is:

1. A visible component for a motor vehicle, comprising a base body with a visible surface and at least one sensor element on the visible surface of the base body, the at least one sensor element being electrically connected to at least one element adjoining the at least one sensor element for wireless data transmission, by which measurement data from the sensor element can be transmitted wirelessly to an evaluation unit, wherein the at least one sensor element is connected to the element for wireless data transmission via at least one amplification circuit and at least one preprocessing circuits, and the element for wireless data transmission can be energized by an inductive activation element, and wherein a sequence of layers is applied to the base body, the sequence comprising:

a) a layer containing the at least one element for wireless data transmission;
b) a layer containing the at least one signal amplification circuit;
c) a layer containing the at least one signal processing circuit;
d) a layer containing the visible surface and the at least one sensor element;
e) optionally a layer containing at least one wavelength modulator; and
f) optionally encapsulation.

2. The visible component according to claim 1, wherein the element for wireless data transmission is printed on the visible surface of the base body or on a carrier film which is arranged on the visible surface.

3. The visible component according to claim 2, wherein the carrier film is a self-adhesive or magnetic film.

4. The visible component according to claim 1, wherein the element for wireless data transmission is a passive RFID transponder.

5. The visible component according to claim 4, wherein the passive RFID transponder is integrated under the at least one sensor element as a printed circuit.

6. The visible component according to claim 1, wherein the at least one sensor element is provided for receiving radiation.

7. The visible component according to claim 1, wherein the at least one sensor element is constructed as an OLED and comprises 3 to 5 layers.

8. The visible component according to claim 1, which comprises at least two sensor elements which are set up for the reception of radiation of different wavelength ranges.

9. The visible component according to claim 1, wherein the at least one sensor element and the visible surface of the base body are at least partially covered by a common layer of a coating material.

10. The visible component according to claim 1, wherein more than one inductive voltage supply is used to energize the element for wireless data transmission.

11. The visible component according to claim 2, wherein the element for wireless data transmission is a passive RFID transponder.

12. The visible component according to claim 3, wherein the element for wireless data transmission is a passive RFID transponder.

13. The visible component according to claim 2, wherein the at least one sensor element is provided for receiving radiation.

14. The visible component according to claim 3, wherein the at least one sensor element is provided for receiving radiation.

15. The visible component according to claim 4, wherein the at least one sensor element is provided for receiving radiation.

16. The visible component according to claim 5, wherein the at least one sensor element is provided for receiving radiation.

* * * * *